United States Patent [19]
Hayashi

[11] Patent Number: 4,994,879
[45] Date of Patent: Feb. 19, 1991

[54] PHOTOELECTRIC TRANSDUCER WITH LIGHT PATH OF INCREASED LENGTH

[75] Inventor: Yutaka Hayashi, Tsukuba, Japan

[73] Assignee: Agency of Industrial Science & Technology, Ministry of International Trade & Industry, Tokyo, Japan

[21] Appl. No.: 434,253

[22] Filed: Nov. 13, 1989

[30] Foreign Application Priority Data

Nov. 25, 1988 [JP] Japan ................. 63-297871

[51] Int. Cl.⁵ .............. H01L 27/14; H01L 31/00; H01L 29/06
[52] U.S. Cl. .................... 357/30; 136/256; 357/55
[58] Field of Search ............. 357/30, 55; 136/256

[56] References Cited

U.S. PATENT DOCUMENTS

| | | | |
|---|---|---|---|
| 4,072,541 | 2/1978 | Meulenberg, Jr. et al. | 357/55 |
| 4,253,882 | 3/1981 | Dalal | 357/30 E |
| 4,321,611 | 3/1982 | Conti | 357/55 |
| 4,497,974 | 2/1985 | Deckman et al. | 357/30 L |
| 4,514,582 | 4/1985 | Tiedje et al. | 357/30 D |
| 4,532,537 | 7/1985 | Kane | 357/30 D |
| 4,568,791 | 2/1986 | Kawai | 357/30 Q |
| 4,571,448 | 2/1986 | Barnett | 136/256 |
| 4,599,482 | 7/1986 | Yamazaki | 357/55 |
| 4,644,091 | 2/1987 | Hayashi et al. | 357/55 |
| 4,689,438 | 8/1987 | Fukatsu et al. | 357/30 Q |
| 4,703,337 | 10/1987 | Yamazaki | 357/55 |
| 4,922,218 | 5/1990 | Watanabe et al. | 357/30 K |

OTHER PUBLICATIONS

G. Crotty et al., "Radiation Characteristics of Low Resistivity Float Zone Silicon Solar Cells", IEEE Photovoltaic Specialists Conf. (1987) pp. 715–717.

*Primary Examiner*—Andrew J. James
*Assistant Examiner*—Cynthia S. Deal
*Attorney, Agent, or Firm*—Oblon, Spivak, McClelland, Maier & Neustadt

[57] ABSTRACT

A photoelectric transducer includes a planar transduction element portion which has a thickness and an upper and lower surface and in which incident light produces the photoelectric conversion. An optically transparent textured layer is formed on an optically transparent protective layer and provided on at least one of the surfaces of the planar transduction element portion.

17 Claims, 2 Drawing Sheets

PHOTOELECTRIC TRANSDUCER WITH LIGHT PATH OF INCREASED LENGTH

BACKGROUND OF THE INVENTION

1. Field of the Invention

This invention relates to a photoelectric transducer.

2. Prior Art Statement

There has been a number of approaches to increasing the efficiency of photoelectric transducers. One way of providing an overall improvement in the conversion efficiency of the transducer by mechanical or physical structural adaptations is a method employed for crystalline silicon solar cells. In this method, one of the upper and lower surfaces of the p-n junction or other such planar semiconductor structure which forms the transduction element where the photoelectric conversion takes place is textured. Anisotropic etching of crystalline surface is employed to form clusters of pyramid-shaped or wave-shaped projections directly on the said surface.

In the absence of such surface texturing, light impinging perpendicularly onto the transducer will pass through the planar transduction element portion by the shortest route, in the thickness direction. However, if the propagation of the light is at an angle, in effect the length of the light path through the planar transduction element portion will be increased, enabling more of the incident light, and light reflected from the surface on the opposite side to the incident light surface, to be utilized in the photoelectric conversion process.

However, the method whereby the texturing is formed directly on the surface of the planar transduction element portion by etching is only effective with crystal systems having anisotropic etching characteristics, and even then only on a (100) plane, is not applicable to surfaces that do not have such anisotropic etching characteristics, such as polycrystals with no specific crystal plane index, or to a crystal system with a (111) plane. In addition, in optical terms an improvement in conversion efficiency usually can be expected, but because the surface with the pyramid-shaped or wave-shaped texture elements thus formed by anisotropic etching has a high carrier recombination velocity, electrically there is an increase in the conversion loss. The overall result has therefore been an insufficient improvement effect.

OBJECT AND SUMMARY OF THE INVENTION

The object of the present invention is therefore to provide a photoelectric transducer in which the length of the incident light path through the planar transduction element portion, or that of the reflected light path, is effectively increased and electrical degradation is prevented or minimized, regardless of whether the portion where the photoelectric conversion takes place is a p-n junction, hetero junction or some other type of junction and regardless of the type of material or conversion mechanism of the particular planar transduction element portion.

To attain the above object, the photoelectric transducer according to the present invention comprises a thickness dimension bounded by upper and lower surfaces, and a planar transduction element portion in which photoelectric conversion takes place when light impinges upon it;

wherein at least one of the incident light surface and the opposite surface of the planar transduction element portion is provided with an optically transparent textured layer formed on an optically transparent protective layer.

Unlike the conventional method in which the surface of the planar transduction element portion is directly processed, the surface textured layer according to this invention is fabricated as a separate layer or coating. The surface textured layer may be provided on the incident light side of the planar transduction element portion, or on the opposite side, or on both sides. The surface textured layer may also be made conductive. If this is done, an efficient arrangement could be provided by forming an ohmic contact on the surface of the planar transduction element portion via an opening in the protective layer, and utilizing the conductive surface textured layer as at least a part of one of a pair of output electrodes for the photoelectric transducer.

When the surface textured layer is to be formed on the side of the planar transduction element portion opposite to the incident light side, a further layer of high-reflectivity material may be provided on the surface textured layer to form a reflective layer. Forming the reflective layer of a suitable metallic material, although such a reflective layer is not limited to a metallic material, would be an efficient way of enabling the said surface to be utilized also as an electrode layer.

In accordance with the present invention, when the surface textured layer is provided on the incident light side of the planar transduction element portion, the light can be directed in various directions before its entry into the planar transduction element portion, even when the incidence of the light is perpendicular to the incident light surface of the transduction element portion. Therefore, in effect the length of the light path through the planar transduction element portion can be increased compared to when there is no surface textured layer and the incident light passes through the planar transduction element portion by the shortest route, enabling the overall conversion efficiency of the transducer to be increased.

Providing the surface textured layer on the side of the planar transduction element portion opposite to the incident light side causes the light that is reflected after passing through the transduction element portion to be scattered in various directions, and at various angles, by the surface textured layer, increasing the length of the path of the reflected light and thereby contributing to an increase in the overall conversion efficiency.

A further increase in conversion efficiency can be attained by providing a surface textured layer on both sides of the planar transduction element portion, each formed on an intervening protective layer. The protective layer also has the effect of stabilizing the electrical characteristics of the planar transduction element portion and reducing the surface recombination velocity. Direct contact between the surface textured layer and the planar transduction element portion can allow any carriers that may be created to flow from the planar transduction element portion to the surface textured layer, so the protective layer also prevents this and protects the formed surface from contamination.

The above and other objects and features of the invention will become more apparent from the following detailed description with reference to the accompanying drawings.

DETAILED DESCRIPTION OF THE PREFERRED EMBODIMENTS

Figure 1:
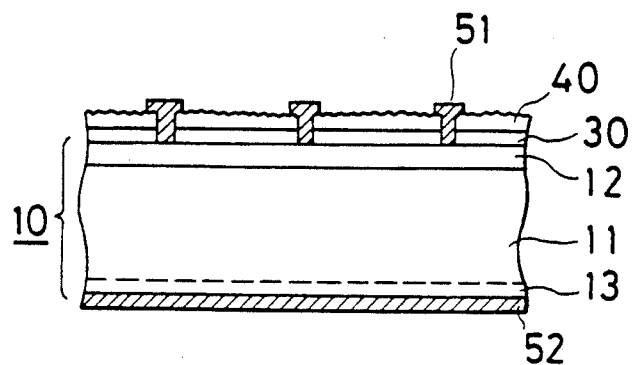
FIG. 1 is a sectional view of a first embodiment of the photoelectric transducer according to the present invention in which the transduction element portion is comprised of two semiconductor layers.

FIG. 1 is a sectional view of a first embodiment of the photoelectric transducer according to the present invention. In the drawing the planar transduction element portion 10, in which incident light gives rise to the photoelectric conversion process, is comprised of a first semiconductor layer 11 and a second semiconductor layer 12. The semiconductor layers 11 and 12 should be arranged so that a built-in field is formed whereby carriers produced by the light can be separated, the most typical such arrangement being the conventionally known p-n junction.

In addition to the p-n junction, which is a junction between layers of the same semiconductor material but different conductivity types, there are also the heterojunction, which consists of layers of different semiconductor materials, and multilayer structures with three or more layers, the simplest of which is the p-i-n type. In principle any conventional type may be utilized for the planar transduction element portion 10 in which carriers are excited by incident light. Any of the various photoelectric transduction principles, which include the photovoltaic effect and the photoconductive effect, may be used.

A single layer of semiconductor material may be used, which may be considered the same as the illustrated layered structure comprised of the semiconductor layers 11 and 12. In such a case, the region corresponding to the second semiconductor layer 12 would be formed as an inversion layer electrically induced at the surface of the first semiconductor layer 11.

In the embodiment shown in FIG. 1, the exposed surface on the second semiconductor layer 12 side of the planar transduction element portion 10 is used as the light incident surface, on which a protective layer 30 is then formed, and on that a surface textured layer 40 in which the surface is provided with pyramid-shaped or wave-shaped texture elements or other suitable texturing.

The protective layer 30 and surface textured layer 40 are each formed of an optically transparent material. The protective layer 30 is provided to stabilize the electrical characteristics of the surface of the second semiconductor layer 12, and to prevent a drop in the photoelectric conversion efficiency by restricting the carrier recombination velocity in the said surface.

The protective layer 30 prevents the flow to the surface textured layer 40 side of carriers produced in the planar transduction element portion 10, were the second semiconductor layer 12 and the surface textured layer 40 to be in direct contact; and it protects the surface of the planar transduction element portion 10, and the surface of the second semiconductor layer 12, from contamination from impurities used during the formation of the surface textured layer 40. As described later, if the surface textured layer 40 is formed of a metal oxide and there is no protective layer 30, problems may arise such as that the metal may permeate into the planar transduction element portion 10 or the oxygen may cause changes in the surface state density. In practice, sandwiching the protective layer 30 between the planar transduction element portion 10 and the surface textured layer 40 is highly effective. If this is not done, in many cases the effect of a surface textured layer 40 formed according to the present invention will be reduced or nullified.

While the material and internal structure of the protective layer 30 will naturally depend on what planar transduction element portion 10 and surface textured layer 40 are used, a planar structure such as of silicon nitride and silicon oxide is highly effective for preventing contamination while maintaining optical transparency. It is particularly effective for passivation of the lower semiconductor layers when the layers have been formed by plasma CVD, photo-CVD or other such low-temperature film growth technique, and therefore have a high hydrogen content.

When the second semiconductor layer 12 is silicon, using a protective layer 30 with such a two-layer structure in which the surface in contact with the second semiconductor layer 12 is silicon oxide and the outer surface is silicon nitride enables the surface electrons of the second semiconductor layer 12 to be maintained in a favorable state, while forming a three-layer structure by providing a silicon oxide layer that is several tens to several hundred Å thick on the outer side of the silicon nitride surface improves the adhesion of the surface textured layer 40 to the said layer.

The surface textured layer 40 may be formed from layers of oxides of Sn, In, Ta, Ti, Zn, and AlN and the like, and after the layer has been formed it may be textured using mechanical, physical or chemical means, or the layer formation conditions may be adjusted during the formation process so that instead of subsequent processing being required, the requisite surface texturing is achieved with the completion of the growth of the layer.

When vapor deposition is used, for example, the completed layer may be provided with the required surface texturing by raising the layer formation to around 400° C. and keeping the deposition rate relatively low.

When CVD is used and the intention is to form the surface textured layer 40 of $SnO_2$, the desired $SnO_2$ surface textured layer 40 can be achieved by adding water vapor and a small quantity of ethyl alcohol to $SnCl_4$ at a temperature of around 450° C.

When a spray method is used and the surface r textured layer 40 is to be formed as a $SnO_2$ layer, the same starting materials can be used at 470° C. as in the case of the above CVD method, and the same spray method can be used to form the required texturing on a surface textured layer 40 of $In_2O_3$ by adding $InCl_3$ to ethyl alcohol at a temperature of 500° C., and carrying out the spraying in air.

A first embodiment will now be described in more specific detail, with reference to providing the configuration of the photoelectric transducer shown in FIG. 1.

A p-type 1 Ωcm (100) plane crystalline silicon wafer was selected as the starting wafer and was used to form the main region of a first semiconductor layer 11.

On the first semiconductor layer 11 was formed a second semiconductor layer 12 of n-type silicon with a surface impurity concentration of $2 \times 10^{19}/cm^3$ diffused to a depth of 0.3 micron into the surface of the first semiconductor layer 11.

The surface of the second semiconductor layer 12 of n-type silicon was then oxidized to form a silicon oxide layer about 100Å thick, and with $NH_3$ and $SiH_4$ as oxide layer about the starting materials, plasma CVD was then used to form a silicon nitride layer about 700Å thick on the silicon oxide layer at a substrate temperature of 300° to 400° C.

The two-layer structure of silicon oxide and silicon nitride thus fabricated forms the protective layer 30 of this embodiment. The lower layer, of silicon oxide, is effective for reducing the carrier surface recombination velocity of the second semiconductor layer 12 that forms a junction with the said silicon oxide layer. When the second semiconductor layer 12 is a compound semiconductor such as InP or GaAs, a suitable protective layer 30 can be fabricated of a semiconductor that has a wider gap than that of the second semiconductor layer 12, such as $Ga_xIn_{1-x}P$ or $Al_xGa_{1-x}As$, or by direct deposition of the silicon nitride layer.

The surface textured layer 40 can be $SnO_2$ by CVD, using water vapor and $SnCl_4$ with $SbCl_5$ as the starting materials and a substrate temperature of 450° to 500° C. This method was used to grow a surface textured layer 40 of $SnO_2$, 5,000Å in thickness and with a sheet resistance of 30–50 Ω/□ (ohms per square), with pyramid-shaped and knife-edge-shaped surface texturing elements having an average grain size distribution of 0.2 to 0.3 micron.

A conventional technique is used to form an ohmic contact between electrodes 51 and 52 and the upper and lower surfaces of the planar transduction element portion 10 constituted by the semiconductor layers 11 and 12. The base electrode 52 is formed as a uniform layer over the entire lower surface of the planar transduction element portion 10. Therefore, with the aim of achieving a good ohmic contact between the electrode 52 and the surface of the first semiconductor layer 11, a diffused aluminum layer 13 about 5 micron thick is formed on the said surface. The aluminum-diffused layer 13 also functions as a built-in field for reflecting minority carriers in the first semiconductor layer 11 toward the upper surface, which also helps to improve the conversion efficiency. For reference, it may be noted that the built-in field effect of the layer can also be achieved by forming a highly-doped region in the lower surface of the first semiconductor layer 11 or using a semiconductor layer that has a wider gap than that of the first semiconductor layer 11.

The electrode 51 pattern is arranged on the incident light side in such a way that it does not produce a marked decrease in the effective incident light area of the planar transduction element portion 10. Through holes are formed in the protective layer 30 and surface textured layer 40 to allow an ohmic contact between the electrode 51 and the planar transduction element portion 10.

Compared to an arrangement in which there is no surface textured layer 40, it was observed that a photoelectric transducer thus configured reflects less of the incident light, with the improvement being particularly pronounced in the relatively short wavelength regions, i.e. up to about 900 nm, thereby improving the conversion efficiency. The improvement effect is considerable, even compared to a photoelectric transducer on which the crystal surface itself has been textured by the conventional anisotropic etching process, and the $V_{OC}$ value is also higher.

Generally speaking, any existing texturing method will produce a surface textured layer 40 in which the texture elements have a more or less triangular or trapezoidal cross-section. In terms of the plane projection dimensions, as viewed from above, when the length of the diagonal exceeds about 0.15 micron the surface reflectivity starts to decrease, starting with the shorter wavelengths and expanding to the longer wavelengths as the said dimension increases. As such, in the case of photoelectric transducers that convert visible light and sunlight, conversion efficiency is improved by making the said plane projection dimension at least 0.15 micron.

In the above specific embodiment, as an experiment, the protective layer 30 was omitted and the surface textured layer 40 was formed directly on the second semiconductor layer 12. However, the good electrical characteristics of the second semiconductor layer 12 could not be maintained and there was a large drop in the sensitivity to short wavelengths. This indicates the significance of the protective layer 30.

Figure 2:
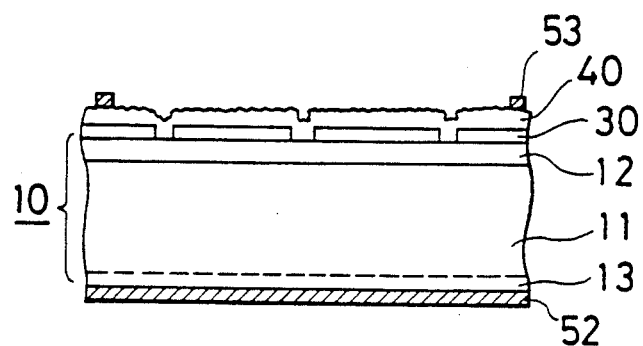
FIG. 2 is a sectional view of a second embodiment of the photoelectric transducer according to the present invention in which the surface textured layer is formed of a conductive material.

FIG. 2 shows a second embodiment of the present invention. In the figure, the same reference numerals as those used in FIG. 1 denote the same or similar structural elements, and the same description also applies. The major difference between this embodiment and the first embodiment is that the material used to form the surface textured layer 40 is electrically conductive as well as being optically transparent, and forms part of the electrode on the incident light side.

As before, the protective layer 30 formed on the second semiconductor layer 12 has an appropriate number and pattern of holes formed therethrough via which the light-transparent, conductive material of the surface textured layer 40 formed on the protective layer 30 can form an ohmic contact with the planar transduction element portion 10.

Thus, impurities used during the formation of the surface textured layer can penetrate into the surface region of the planar transduction element portion 10 via the holes in the protective layer 30. While there is a possible risk of this having an adverse effect on the electrical characteristics, this risk can be adequately averted by making the holes as small as possible within the permissible limits in terms of the performance, especially in the design of series resistance, of the electrodes formed by the conductive material filling the holes.

The arrangement of this embodiment, as illustrated in FIG. 2, could be used instead of the arrangement shown in FIG. 1, when the material of a separately formed electrode, such as electrode 51, will react with the surface region of the planar transduction element portion 10.

The embodiment shown in FIG. 2 offers far more design flexibility than when the electrode pattern has to be arranged while worrying about the decrease in the effective incident light area.

To connect the transducer to the external circuitry, a metal electrode portion 53 that is connected to the conductive surface textured layer 40 could be provided at suitable locations on the surface textured layer 40.

Figure 3:
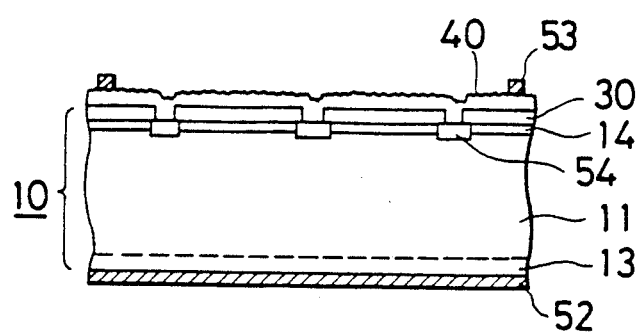
FIG. 3 is a sectional view of a third embodiment of the photoelectric transducer in which the transduction element portion is comprised of one semiconductor and an inversion layer formed at the surface of the semiconductor.

FIG. 3 shows a third embodiment of the present invention. In the figure, the same reference numerals as those used in FIG. 1 denote the same or similar structural elements, and the same description also applies. In this embodiment, instead of a junction between the first semiconductor layer 11 and a second semiconductor layer 12, an inversion layer 14 is created in the surface region of the first semiconductor layer 11, and the photoelectric transduction takes place between this inversion layer and the first semiconductor layer 11.

When, in accordance with this invention, the surface textured layer 40 is provided on the planar transduction element portion 10 formed on an intervening protective layer 30, the inversion layer 14 is produced on the surface of the first semiconductor layer 11 as a result of a charge-storage effect in the protective layer 30 or the surface textured layer 40, or at the boundary between the surface textured layer 40 and the protective layer 30, and/or a work function differential between the surface textured layer 40 and the first semiconductor layer 11 of the planar transduction element portion. As in the second embodiment, the surface textured layer 40 can be formed of a conductive material, and a metal output electrode 53 can be provided at suitable locations on the surface textured layer 40.

Thus, the conductive surface textured layer 40 is connected to the inversion layer 14 via the portion in the holes formed in the protective layer 30, and the contact characteristics can be improved by providing an impurity region 54 at the area on the surface of the first semiconductor layer 11 that contacts the constituent material of the surface textured layer 40, the impurity region 54 forming a rectified junction with the first semiconductor layer 11.

As in the first embodiment, a surface textured layer 40 that is light-transparent but non-conductive may be provided with through-holes being formed in the surface textured layer 40 and the protective layer 30 and filled with metal electrode material to form output electrodes, in which case the impurity region 54 can be effectively utilized.

In the embodiments described with reference to FIGS. 1 to 3, the protective layer 30 and the surface textured layer 40 have been provided on the incident light side of the planar transduction element portion 10 as a set. Forming the surface textured layer 40 on the incident light side provides a considerable increase in the sensitivity to incident light in the relatively short-wavelength regions.

On the other hand, providing the protective layer 30 and surface textured layer 40 on the side of the planar transduction element portion 10 opposite to the incident light side provides a considerable increase in the sensitivity to incident light in the relatively longer wavelength regions.

The relation between the plane dimensions of the texture elements, and the wavelength regions in which conversion efficiency is increased has already been described above. As the size of the texture elements increases, the increase in conversion efficiency extends further towards longer wavelengths.

Figure 4:
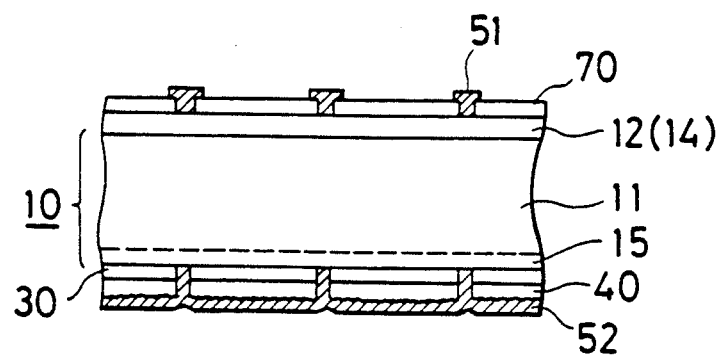
FIG. 4 is a sectional view of a fourth embodiment in which the surface textured layer is provided on the side of the planar transduction element portion opposite to the incident light side.

In the embodiment shown in FIG. 4, the protective layer 30 and surface textured layer 40 are provided on the opposite side. In this embodiment also, the structure of the planar transduction element portion 10 may be selected from among various types, in addition to the illustrated arrangement in which a second semiconductor layer 12, as shown in FIGS. 1 and 2, is provided on the first semiconductor layer 11 to form a rectified junction, or, as shown in the FIG. 3 embodiment, an inversion layer 14 induced in the surface region of the first semiconductor layer 11 acts in synergy with the first semiconductor layer 11 to assist in the conversion action. Also, any known arrangement used in existing photoelectric transducers may be adapted and incorporated with respect to providing the layers on the incident light side.

For example, the surface region on the incident light side or of the second semiconductor layer 12 of the planar transduction element portion 10 may be provided with an optically transparent anti-reflection coating 70 that doubles as a protective layer, with an ohmic contact being provided between electrode 51 and the planar transduction element portion 10, via holes in the anti-reflection coating 70. Also, when the second semiconductor layer 12 is formed as an inversion layer 14, as in FIG. 3, a region corresponding to the impurity region 54 may be provided to achieve a good ohmic contact.

In accordance with this invention a surface textured layer 40 is deposited on the protective layer 30 on the opposite side of the planar transduction element portion 10, and then the electrode 52 is formed. In this case, the electrode 52 doubles as a reflective coating whereby the light is reflected back into the planar transduction element portion 10 and would, therefore, be scattered by the surface textured layer 40 of this invention, thereby effectively lengthening the light path.

Through holes are formed in the protective layer 30 and surface textured layer 40 to allow an ohmic contact between the electrode 52 and the surface of the transduction element portion 10.

Also, a semiconductor layer of the same conductive type as the first semiconductor layer 11 but with a higher concentration of impurities or a wider gap, and/or a majority carrier accumulation layer, may be formed on the lower surface of the first semiconductor layer 11 as a built-in layer 15 for reflecting minority carriers in the semiconductor layer 11 toward the upper surface.

When the surface textured layer 40 is provided on the planar transduction element portion 10 formed on an intervening protective layer 30 on which it is formed, in accordance with this invention, an accumulation layer may be formed by a charge-storage effect in the protective layer 30 or surface textured layer 40, or at the boundary between the surface textured layer 40 and the protective layer 30, and/or by a work function differential between the surface textured layer 40 and the first semiconductor layer 11 of the planar transduction element portion. As shown in FIGS. 2 and 3, forming an ohmic contact region 13 formed of a suitable material enables a good ohmic contact to be provided for the electrode 52.

It has been described how, in accordance with the present invention, the protective layer 30 and surface textured layer 40 may be selectively provided on the incident light side or on the opposite side of the planar transduction element portion 10. It goes without saying that the arrangements described in the embodiments can be appropriately combined as desired.

Figure 5:
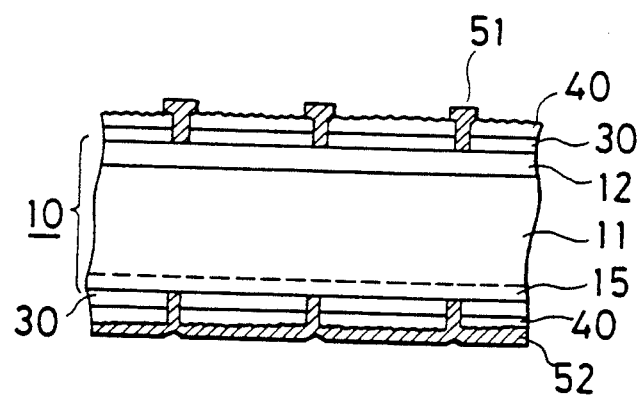
FIG. 5 is a sectional view of a fifth embodiment in which the surface textured layer is provided on the incident light side and on the opposite side.

Thus, for example, as shown in FIG. 5, two sets of the protective layer 30 and surface textured layer 40 may be provided, one on the incident light side and one on the opposite side, with a consequent multiplication of the advantageous effects of each arrangement.

The present invention endeavors to substantially lengthen the light path through the planar transduction element portion by using a textured layer. It accomplishes this aim with absolutely none of the conventional type of restrictions relating to material and with no sacrifice of electrical characteristics. It thus provides a general and effective improvement in the conversion efficiency of the photoelectric transducer.

What is claimed is:

1. A photoelectric transducer with a light path of increase length, comprising:

a planar transduction element portion having a thickness dimension which is bounded by an incident light surface and an opposite surface substantially opposite to the light incident surface, wherein incident light causes photoelectric conversion;

an optically transparent protective layer which is provided at at least one of the incident light surface and the opposite surface of the planar transduction element portion to reduce carrier recombination at the associated surface of the planar transduction element portion at which the protective layer is provided to prevent introduction of an impurity into the associated surface of the planar transduction element portion; and an optically transparent textured layer, with a textured surface and a planar surface, formed on the protective layer so that the planar surface is in contact with said protective layer.

2. A photoelectric transducer according to claim 1, wherein the textured layer is provided at the incident light surface of the planar transduction element and the protective layer is positioned between the textured layer and the light incident surface.

3. A photoelectric transducer according to claim 1, wherein the textured layer is conductive and in ohmic contact with the associated surface of the planar transduction element portion at which the protective layer is provided by way of holes formed in a portion of the protective layer.

4. A photoelectric transducer according to claim 1, wherein the textured layer is provided at the opposite surface of the planar transduction element portion and the protective layer is positioned between the textured layer and the opposite surface.

5. A photoelectric transducer according to claim 1, wherein the textured layer is provided at both the incident light surface and the opposite surface of the planar transduction element portion, and wherein the protective layer is respectively provided between each textured layer and the planar transduction element.

6. A photoelectric transducer according to claim 1, wherein the protective layer is formed of silicon nitride.

7. A photoelectric transducer according to claim 1, wherein the textured surface is formed of an oxide of Sn.

8. A photoelectric transducer according to claim 1, wherein the textured surface of the textured layer has a diagonal having a length of at least 0.15 microns.

9. A photoelectric transducer according to claim 5, wherein at least one of the textured layers is conductive and in ohmic contact with the planar transduction element portion by way of holes formed in a portion of the protective layer.

10. A photoelectric transducer according to claim 5, wherein both of the textured layers are conductive and in ohmic contact with the planar transduction element portion by way of holes formed in a portion of the protective layer.

11. A photoelectric transducer according to claim 1, wherein the protective layer is formed of silicon oxide.

12. A photoelectric transducer according to claim 1, wherein the textured layer is formed of an oxide of In.

13. A photoelectric transducer according to claim 1, wherein the textured layer is formed of an oxide of Ta.

14. A photoelectric transducer according to claim 1, wherein the textured layer is formed of an oxide of Ti.

15. A photoelectric transducer according to claim 1, wherein the textured layer is formed of an oxide of Zn.

16. A photoelectric transducer according to claim 1, wherein the textured layer is formed of an oxide of AlN.

17. A photoelectric transducer according to claim 1, wherein the incident light surface and opposite surface of the planar transducer element portion are both substantially planar.

* * * * *